(12) United States Patent
Mueller et al.

(10) Patent No.: US 9,373,715 B2
(45) Date of Patent: Jun. 21, 2016

(54) SEMICONDUCTOR DEVICES INCLUDING VERTICAL MEMORY CELLS AND METHODS OF FORMING SAME

(71) Applicant: Micron Technology, Inc., Boise, ID (US)

(72) Inventors: Wolfgang Mueller, Garden City, ID (US); Sanh D. Tang, Boise, ID (US); Sourabh Dhir, Boise, ID (US); Srinivas Pulugurtha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 12 days.

(21) Appl. No.: 14/075,480

(22) Filed: Nov. 8, 2013

(65) Prior Publication Data

US 2015/0129955 A1 May 14, 2015

(51) Int. Cl.
| | |
|---|---|
| *H01L 29/78* | (2006.01) |
| *G11C 11/40* | (2006.01) |
| *H01L 27/02* | (2006.01) |
| *H01L 27/105* | (2006.01) |
| *H01L 29/66* | (2006.01) |
| H01L 27/108 | (2006.01) |

(52) U.S. Cl.
CPC ............ *H01L 29/7827* (2013.01); *G11C 11/40* (2013.01); *H01L 27/0207* (2013.01); *H01L 27/1052* (2013.01); *H01L 27/10873* (2013.01); *H01L 27/10885* (2013.01); *H01L 29/66666* (2013.01); *H01L 27/10855* (2013.01); *H01L 27/10891* (2013.01)

(58) Field of Classification Search
CPC combination set(s) only.
See application file for complete search history.

(56) References Cited

U.S. PATENT DOCUMENTS

| | | | |
|---|---|---|---|
| 5,087,581 A * | 2/1992 | Rodder ............... | H01L 29/1033 257/E21.41 |
| 5,382,816 A * | 1/1995 | Mitsui ............... | H01L 27/10841 257/265 |
| 6,355,520 B1 | 3/2002 | Park et al. | |
| 6,441,422 B1 | 8/2002 | Mandelman et al. | |
| 7,141,845 B2 | 11/2006 | Manger et al. | |
| 7,378,702 B2 | 5/2008 | Lee | |
| 7,387,931 B2 | 6/2008 | Seo et al. | |
| 7,489,002 B2 | 2/2009 | Forbes et al. | |
| 7,611,931 B2 | 11/2009 | Cheng et al. | |
| 7,759,188 B2 | 7/2010 | Cheng et al. | |
| 2007/0045697 A1 | 3/2007 | Cheng et al. | |
| 2008/0173920 A1 | 7/2008 | Juengiing | |
| 2008/0237708 A1* | 10/2008 | Mandelman ...... | H01L 29/78615 257/347 |

(Continued)

OTHER PUBLICATIONS

Date et al., Suppression of the Floating-Body Effect Using SiGe Layers in Vertical Surrounding-Gate MOSFETSs, IEEE Transactions on Electron Devices, vol. 48, No. 12, Dec. 2001, pp. 2684-2689.

(Continued)

*Primary Examiner* — Ali Naraghi
(74) *Attorney, Agent, or Firm* — TraskBritt

(57) ABSTRACT

A semiconductor device may include a memory array including vertical memory cells connected to a digit line, word lines, and a body connection line. A row or column of the memory array may include one or more pillars connected to the body connection line. A voltage may be applied to the body connection line through at least one pillar connected to the body connection line. Application of the voltage to the body connection line may reduce floating body effects. Methods of forming a connection between at least one pillar and a voltage supply are disclosed. Semiconductor devices including such connections are also disclosed.

23 Claims, 12 Drawing Sheets

(56) References Cited

U.S. PATENT DOCUMENTS

2010/0224924 A1* 9/2010 Ellis .................. H01L 27/108
   257/300
2012/0080725 A1 4/2012 Manos et al.
2013/0095645 A1 4/2013 Forbes

OTHER PUBLICATIONS

Karda et al., U.S. Appl. No. 13/782,792 titled "Vertical Access Device and Apparatuses Having a Body Connection Line, and Related Method of Operating the Same", filed Mar. 1, 2013.

* cited by examiner

SEMICONDUCTOR DEVICES INCLUDING VERTICAL MEMORY CELLS AND METHODS OF FORMING SAME

CROSS-REFERENCE TO RELATED APPLICATION

This application is related to U.S. patent application Ser. No. 13/782,792, filed Mar. 1, 2013, now U.S. Pat. No. 8,878, 271, issued Nov. 4, 2014, entitled "VERTICAL ACCESS DEVICE AND APPARATUSES HAVING A BODY CONNECTION LINE, AND RELATED METHOD OF OPERATING THE SAME," the disclosure of which application is hereby incorporated herein in its entirety by this reference.

TECHNICAL FIELD

Embodiments disclosed herein relate to semiconductor devices including memory arrays having vertical memory cells and methods of forming such devices. More specifically, embodiments disclosed herein relate to structures for supplying a separate voltage to a body connection line of vertical memory cells and methods of forming such structures.

BACKGROUND

The use of an access device with a storage element in memory cells is well known in the art. Examples of memory devices that utilize access devices include dynamic random-access memory (DRAM), resistive random-access memory (RRAM), magnetoresistive random-access memory (MRAM), and phase-change random-access memory (PRAM).

An ever-increasing demand for higher-density memory cell arrays has lead to the development of vertical memory cell devices. Vertical memory cell devices may enable higher-density cell arrays by offsetting an access device vertically from a storage element, which arrangement utilizes less horizontal area, termed "real estate," on the array substrate than if the access device were offset horizontally from the storage element.

FIG. 1A is a simplified plan view of a portion of a conventional memory cell array 100. The conventional memory cell array 100 includes a plurality of vertical memory cells 101, a plurality of data/sense lines 104, e.g., digit or bit lines, (in dashed lines to show they are buried), and a plurality of access lines 114, e.g., word lines (in dashed lines to show they are buried). The vertical memory cells 101 are arranged in rows (coupled to a common digit line 104) and columns (coupled to a common word line 114). Individual vertical memory cells 101 are located at a cross-point of a digit line 104 and a word line 114.

FIG. 1B is a simplified cross-sectional view of a vertical memory cell 101 taken along line 1B-1B of FIG. 1A. The vertical memory cell 101 may be formed on a substrate 102. The vertical memory cell 101 includes a storage element 110 and an access device such as a transistor. The vertical memory cell 101 includes a digit line 104, a body region 106 disposed on the digit line 104, an electrode 108 disposed on the body region 106, a word line 114 proximate to the body region 106, and a storage element 110 (e.g., a capacitor) disposed on the electrode 108. The vertical memory cell 101 also includes a dielectric material 112 on the substrate 102, and surrounding the vertical memory cell 101. The dielectric material 112 insulates the body region 106 from the word line 114.

The vertical memory cell 101 is configured to establish electrical connection and isolation between the digit line 104 and the storage element 110. In other words, the digit line 104, the body region 106, and the electrode 108 from an access transistor, with the word line 114 functioning as its gate. In use and operation, a first voltage is applied to the word line 114, which may attract charge carriers to a segment of the body region 106 that is proximate to the word line 114. As a result, a conductive channel 116 (in dashed lines to show intermittent presence) may be formed through the body region 106 between the digit line 104 and the electrode 108. The conductive channel 116 enables the digit line 104 to access the storage element 110 for read or write operations.

If the first voltage is removed from the word line 114, the conductive channel 116 may be removed, electrically isolating the storage element 110 from the digit line 104. As a result, by selectively applying the first voltage to the word line 114, electrical connection and isolation between the digit line 104 and the storage element 110 is established. In addition, different combinations of voltages may be applied to the word line 114 and the digit line 104 to select a particular vertical memory cell 101 from the conventional memory cell array 100 for a read or write operation.

Although the vertical memory cell 101 may successfully establish electrical connection and isolation between the digit line 104 and the storage element 110, the body region 106 is a floating body. Consequently, the vertical memory cell 101 suffers from floating body effects, which may result in degraded charge retention time in the case of DRAM devices, and power distribution problems in the conventional memory cell array 100.

Conventional solutions to reduce floating body effects often require additional processing acts and consume increased surface area of the memory array for a given number of memory cells. For example, a bias voltage that is different than a voltage applied to the conductive lines (e.g., digit lines, word lines, etc.) may be applied to the vertical memory cells 101 to reduce floating body effects. However, connecting the vertical memory cells 101 to the bias voltage may require complex processing acts such as complex lithographic techniques and may increase the surface area for the semiconductor device. It would, however, be desirable to reduce or eliminate the floating body effects of vertical memory cells without significantly increasing the number of processing acts and array surface area.

DETAILED DESCRIPTION

Figure 1A:
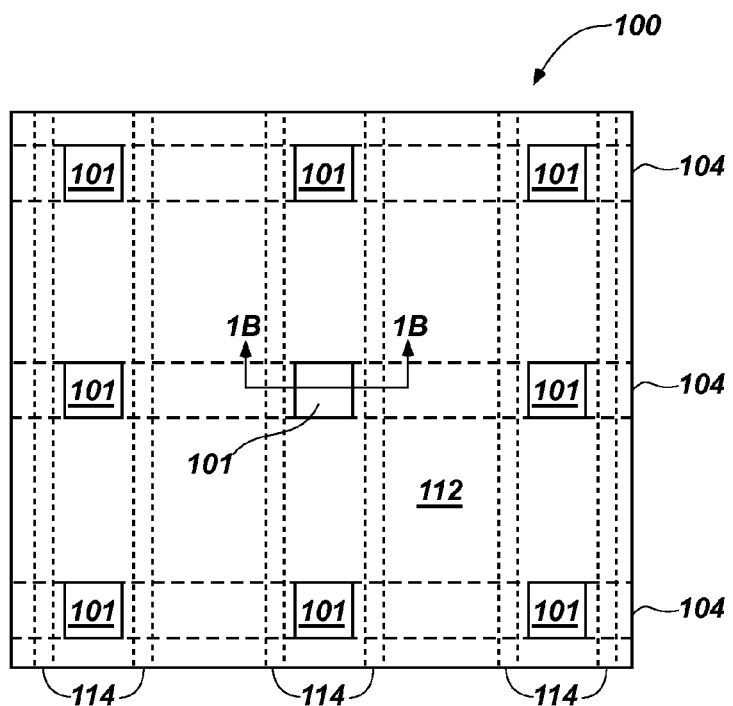
FIG. 1A is a simplified plan view of a portion of a conventional memory cell array.
Figure 1B:
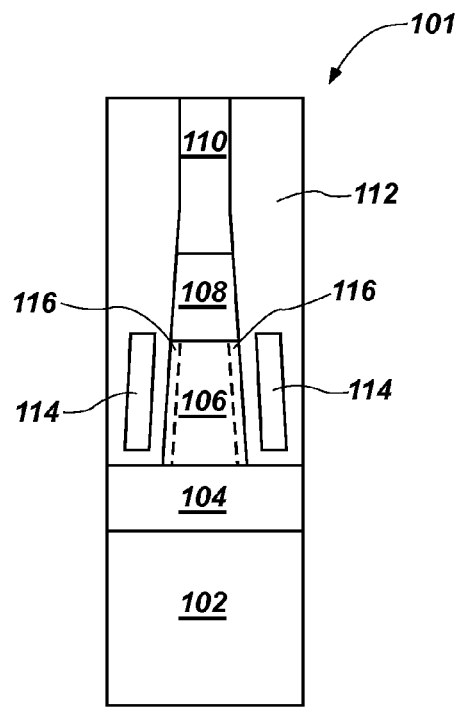
FIG. 1B is a simplified cross-sectional view of a conventional vertical memory cell taken along line 1B-1B of FIG. 1A.

The illustrations included herewith are not meant to be actual views of any particular systems or vertical access devices, but are merely idealized representations that are employed to describe embodiments described herein. Elements and features common between figures may retain the same numerical designation except that, for ease of following the description, for the most part, reference numerals begin with the number of the drawing on which the elements are introduced or most fully discussed.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing vertical memory cells, and the vertical memory cells described below does not form a complete semiconductor device. Only those process acts and structures necessary to understand the embodiments described herein are described in detail below. Additional acts to form a complete semiconductor device including the vertical memory cells may be performed by conventional techniques.

Floating body effects associated with floating bodies include the opening of parasitic transistors, and issues controlling threshold voltage and leakage currents. Embodiments disclosed herein include methods and devices for reducing or eliminating floating body effects in vertical memory cells within a memory array. The floating body effects may be reduced by applying a voltage to a body portion of each of the vertical memory cells in the memory array. The voltage may be applied to the body portion of each vertical memory cell through a body connection line underlying each of the vertical memory cells. The body connection line may be connected to a voltage supply through one or more pillars, one or more word lines, or combinations thereof. It should be noted that while the utility and application of the various embodiments of the present disclosure are described with reference to memory devices including memory arrays and vertical memory cells, the disclosure also finds application to any other semiconductor device, including without limitation, so-called "system-on-a-chip" (SOC) devices where a vertical access device may be used.

According to embodiments disclosed herein, the separate voltage applied to the body connection line may be applied without increasing the memory array surface area and without providing additional wiring levels within the memory array. Thus, the use of complex lithographic techniques, which otherwise would be needed to form the additional interconnects, is avoided. In certain embodiments, the body portion of each vertical memory cell is connected to a voltage supply utilizing existing wiring lines or contact structures within the device. Therefore, additional interconnects, other than interconnects that have already been faulted for conductive word lines or digit lines, may not be required to apply a voltage to the body connection line. The voltage may be applied to the body connection line without increasing the memory array surface area by using an existing silicon structure, e.g., a pillar, within the memory array.

Figure 2A:
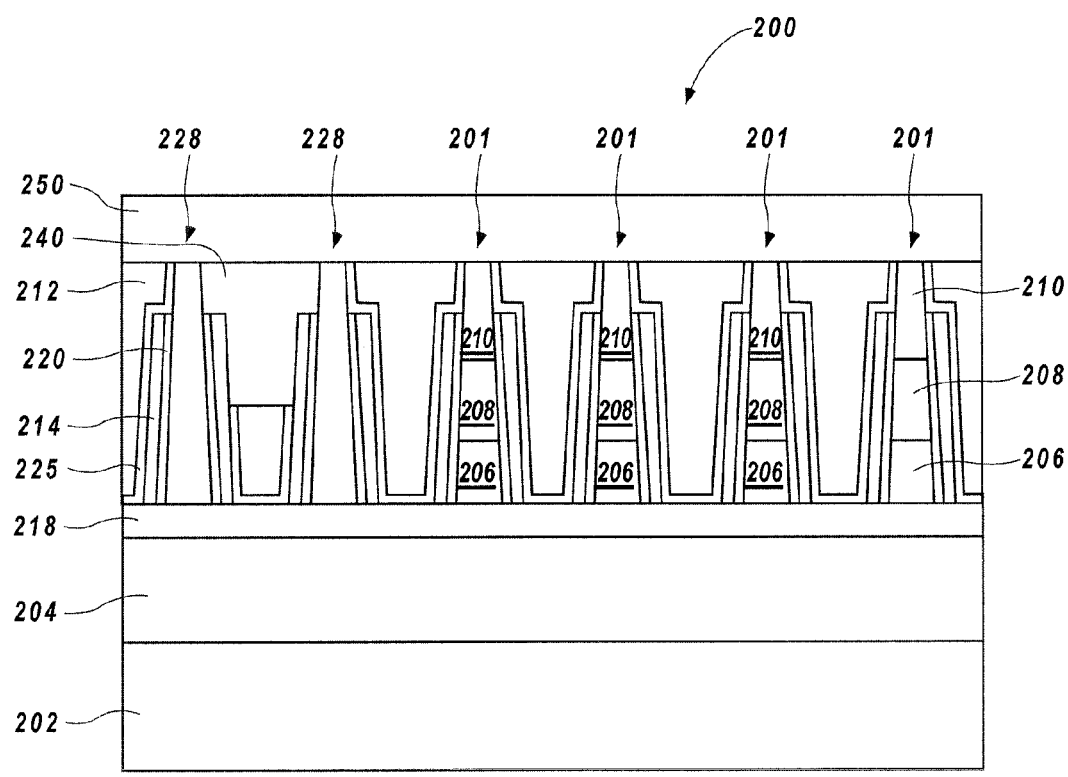
FIG. 2A is a simplified cross-sectional view of a portion of a memory cell array including vertical memory cells and pillars according to other embodiments of the present disclosure.

Embodiments disclosed herein may include a memory array including vertical memory cells. Referring to FIG. 2A, a portion of a row of a memory array 200 including vertical memory cells 201 is shown. The vertical memory cells 201 may be formed on a substrate 202. The substrate 202 may be a base material or construction upon which additional materials are formed. The substrate 202 may be a semiconductor substrate, a base semiconductor layer on a supporting structure, a metal electrode or a semiconductor substrate having one or more layers, structures or regions formed thereon. The substrate 202 may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Individual vertical memory cells 201 may be isolated from one another by dielectric material 212. Dielectric material 212 may comprise any material suitable for electrically isolating structures within the memory array 200. For example, dielectric material 212 may comprise a silicon oxide such as silicon dioxide, a silicon nitride material, or other suitable dielectric material for isolating adjacent vertical memory cells 201. A liner material 225, such as a silicon oxide or a silicon nitride, may overlie the vertical memory cells 201 and may be disposed between dielectric material 212 and the vertical memory cells 201.

Each of the vertical memory cells 201 may include a body region 206, an electrode 208, and a storage element 210 stacked in a vertical arrangement. The storage element 210 may overlie the electrode 208. The electrode 208 may be disposed over the body region 206. The body region 206 may overlie a data/sense line, e.g., digit line 204. The digit line 204, the body region 206, and the electrode 208 may form a vertical access transistor for the storage element 210. Word line 214 may function as a gate between the vertical access transistor and the storage element 210. The electrode 208 may function as a source/drain region and the digit line 204 may function as the other source/drain region of the vertical access transistor to the storage element 210. The term "source/drain region" is used herein to indicate that such a region may function as either a source region or a drain region for the vertical access transistor depending on an operational state of the vertical access transistor. Thus, one of the source/drain regions may function as a source while the other of the source/drain regions functions as a drain, and vice versa.

The storage element 210 may include any device configured to store digital information. By way of non-limiting example, the storage element 210 may be configured as any of a capacitor, a phase change material, a material comprising ionic or thermal resistive switching properties, a magnetoresistive element, a resistive element, a ferroelectric material, a multiferroic material, or other similar materials.

The vertical memory cells 201 may be coupled to access lines (e.g., word lines). For example, each of the vertical memory cells 201 may be located within a particular row and a particular column of the memory array 200. Each row of the memory array 200 may include one or more digit lines 204 and each column of the memory array 200 may include one or more word lines 214. Each row of the memory array 200 may also include one or more body connection lines 218. Individual vertical memory cells 201 may be located at intersections of a digit line 204 and a word line 214. The columns and rows of the memory array 200 may not necessarily physically resemble columns and rows, but are more of an indication of the logical organization for selecting vertical memory cells 201 within the memory array 200. The digit lines 204 and word lines 214, however, may extend in directions that are orthogonal to each other, such that the physical configuration of the vertical memory cells 201 may appear as rows and columns.

Each body connection line 218 may overlie and extend in parallel with a corresponding digit line 204 along the memory array 200. In other words, each of the body connection lines 218 may extend at least substantially continuously along the length of the corresponding digit line 204. In some embodiments, the individual body connection lines 218 may be at least substantially coextensive with its corresponding digit line 204. Each body connection lines 218 may include regions within the body connection line 218 that are more heavily doped than other regions of the body connection line 218. The doping may be accomplished between adjacent pillars of vertical memory cells 201 and may reduce the overall resistance of the body connection lines 218.

The word lines 214 may comprise a conductive material. By way of non-limiting example, the word lines 214 may be formed from polysilicon, a metal, a highly-doped monocrystalline semiconductor material, or combinations thereof. By way of example only, the conductive material may include, but is not limited to, tungsten, a tungsten nitride, titanium, a titanium nitride, a titanium silicide, or combinations thereof. Where the word lines 214 are formed of polysilicon, the word lines 214 may be heavily doped n-type or p-type polysilicon.

Each of the word lines 214 may be connected to a voltage source, such as a metal interconnect (not shown) external to the memory array 200. Word lines 214 from one column of the memory array 200 may be connected to the same or a different interconnect as word lines 214 from another column of the memory array 200. Application of a voltage to the word line 214 through the interconnect may attract charge carriers to a segment of the body region 206 that is proximate to the word line 214. A conductive channel (not shown) may be formed through the body region 206 between the digit line 204 and the electrode 208. The conductive channel enables the digit line 204 to access the storage element 210 for read or write operations.

The electrode 208 may comprise doped semiconductor material of the same carrier type as the digit line 204. The body region 206 may be formed from doped semiconductor material of the same carrier type as the body connection line 218. For example, the digit line 204 may be formed from n-type semiconductor material, the body region 206 may be formed from p-type semiconductor material, and the electrode 208 may be formed from n-type semiconductor material to form a vertical NPN transistor that is activated by the word line 214 acting as the gate. Similarly, in some embodiments, the digit line 204 may be formed from p-type semiconductor material, the body region 206 may be formed from n-type semiconductor material, and the electrode 208 may be formed from p-type semiconductor material to form a vertical pnp transistor that is activated by the word line 214 acting as the gate. In some embodiments, the digit line 204 may be more heavily doped than the body connection line 218.

The body connection line 218 of each row within a memory array 200 may be formed from semiconductor material doped with carriers opposite to the carriers of the digit line 204. By way of non-limiting example, the body connection line 218 may be formed from p-type semiconductor material, and the digit lines 204 may be formed from n-type semiconductor material. Similarly, the body connection line 218 may be formed from n-type semiconductor material, and the digit lines 204 may be formed from p-type semiconductor material.

With continued reference to FIG. 2A, each body region 206 may be disposed on a body connection line 218. In some embodiments, the body connection line 218 may be more heavily doped than the body region 206 of each vertical memory cell 201. The body region 206 may be integrally formed with the body connection line 218 such that a single integral structure may be present. In some embodiments, the body region 206 and the body connection line 218 may be formed by separate fabrication operations such that discrete features are formed. As a result, the body region 206 being "disposed" on the body connection line 218 includes both embodiments of a single integral feature and separate features unless specifically described otherwise.

In use and operation, a combination of voltages may be applied to the word lines 214 and the digit lines 204 to access a particular vertical memory cell 201 within the memory array 200. A first voltage may be applied to the body connection line 218, a second voltage may be applied to the word line 214, and a third voltage may be applied to the digit line 204. The first voltage may be selected to bias a subgroup of the body regions 206 that are disposed on the one or more body connection lines 218 to a desired voltage. As a result, charge build-up within the body regions 206 may be controlled, according to the desired operation, providing control over leakage currents and threshold voltages. Thus, the floating body effects may be reduced or eliminated by connecting the body connection line 218 to a voltage source.

The memory array 200 may include one or more pillars 228. Each of the pillars 228 may be associated with word lines 214. The pillars 228 may be electrically coupled to the body connection line 218. In some embodiments, the word lines 214 may be coupled to the body connection line 218. In other embodiments, the word lines 214 may be isolated from the body connection line 218 by dielectric material 212. Because the pillar 228 and the body connection line 218 are electrically coupled, a voltage applied to the pillar 228 may also be applied to the body connection line 218.

The pillars 228 may be located at a terminal portion of a row or column of the memory array 200. The pillars 228 may also be located intermittently within a row or column of the memory array 200. The pillars 228 may be present within the memory array 200 in areas peripheral to the memory array 200. For example, the pillars 228 may be located in a transition region between a memory array 200 and a peripheral unit, such as, for example, a multiplexer or sense amplifier. In some embodiments, the pillars 228 are formed from a dummy silicon pillar located within the memory array 200. Thus, the pillars 228 may be formed in the same or similar processing acts as formation of the vertical memory cells 201. The silicon material of the pillars 228 may include a doped silicon, such as p-type silicon or n-type silicon. For example, the pillars 228 may be formed of the same material as the body connection line 218. For example, if the body connection line 218 is formed of p-type semiconductor material, the pillars 228 may be formed of p-type semiconductor material. Similarly, if the body connection line 218 is formed of n-type semiconductor material, the pillars 228 may be formed of n-type semiconductor material. In some embodiments, the pillars 228 are formed by implanting a silicon pillar with n-type or p-type impurities. The pillars 228 may be formed by forming silicon and then implanting the silicon with the dopant, or the pillars 228 may be formed by forming the p-type or n-type semiconductor material in situ.

The word lines 214 may be separated from their associated vertical memory cell 201 or pillar 228 by a gate dielectric 220. Although the gate dielectric 220 is shown in FIG. 2A, in some embodiments, the gate dielectric 220 may not be present between the word lines 214 and their associated pillars. In such an embodiment, the word lines 214 may form a direct contact with the vertical memory cells 201 and the pillars 228. In other embodiments, dielectric material 212 may separate the word lines 214 from their associated pillars. Gate dielectric 220 may be formed from any dielectric material such as a silicon oxide, a silicon nitride, a high-k dielectric such as aluminum oxide, hafnium oxide, titanium oxide, tantalum oxide, niobium oxide, molybdenum oxide, strontium oxide, barium oxide, yttrium oxide, zirconium oxide, ruthenium oxide, or a polysilicon material.

As shown in FIG. 2A, a portion of the pillars 228 may be in contact with and electrically connected to the body connection line 218. The word lines 214 may be electrically connected to the body connection line 218 through the pillars 228. A conductive material 240 may electrically connect at least one word line 214 with a pillar 228. The conductive material 240 may make an ohmic connection to the body connection line 218 and two word lines 214 located between adjacent pillars 228. At least a portion of the conductive material 240 may contact at least a portion of the pillars 228. Another portion of the conductive material 240 may contact a portion of at least one word line 214. The conductive material 240 may be located perpendicular to digit lines 204. Therefore, application of a voltage to the at least one word line 214 to which the conductive material 240 is connected may also apply a voltage to the conductive material 240 and the pillar 228 contacting the conductive material 240. The voltage may, therefore, be applied to the body connection line 218 through the pillar 228. The at least one word line 214 may be connected to a voltage source such as a metal interconnect (not shown). The at least one word line 214 contacting the conductive material 240 may be connected to a different voltage source than the word lines 214 of the vertical memory cells 201. Thus, a different voltage may be applied to the conductive material 240 through one word line 214 than a voltage applied to the word lines 214 of the vertical memory cells 201.

Accordingly, a semiconductor device that comprises a pillar adjacent to at least one vertical memory cell of a memory array is disclosed. A body connection line is disposed over a substrate and is electrically connected to the pillar and to a body portion of the at least one vertical memory cell. A first word line is disposed along the pillar. A conductive material is electrically connected to the pillar and to the first word line.

A method of forming an electrical contact between at least one word line 214, conductive material 240, and pillar 228, is described with reference to FIG. 2B through FIG. 2E. Although FIG. 2B through FIG. 2E show only pillars 228, it is noted that vertical memory cells 201 may be disposed over the body connection line 218 as shown in FIG. 2A.

Figure 2B:
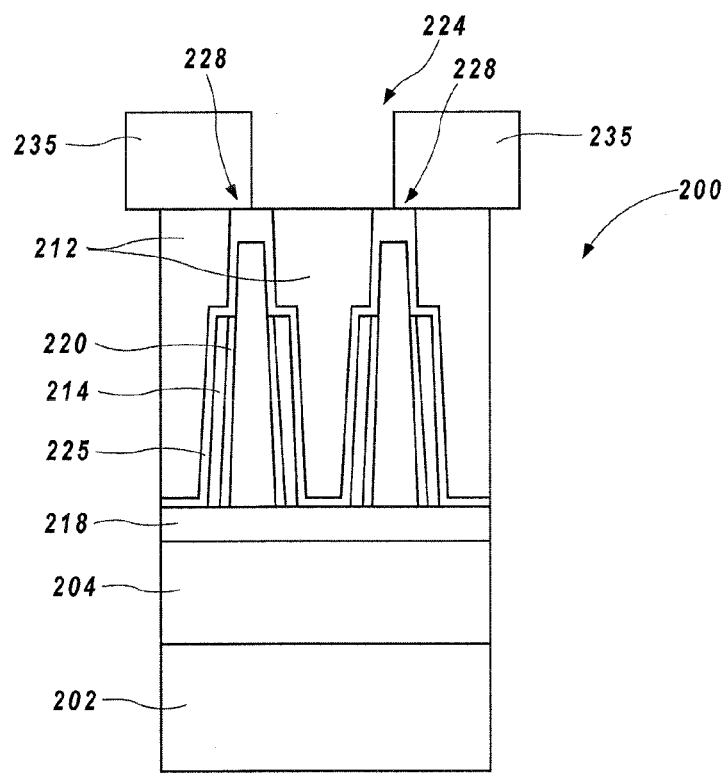
FIG. 2B through FIG. 2E are simplified cross-sectional views showing processing acts for forming the structure of FIG. 2A.

Referring to FIG. 2B, a mask material 235 may be formed (e.g., deposited) over one or more pillars 228. The mask material 235 may include opening 224 within the mask material 235 that has a pitch equal to a pitch between adjacent pillars 228. The opening 224 in the mask material 235 may be formed by conventional techniques, which are not described in detail herein. The mask material 235 may be a photomask (e.g., a photoresist), a hard mask, an amorphous carbon mask, a transparent carbon mask, a negative mask, or any mask suitable for masking a portion of the memory array. The openings 224 in the mask material 235 may be used to remove at least a portion of the dielectric 212 between adjacent pillars 228.

Figure 2C:
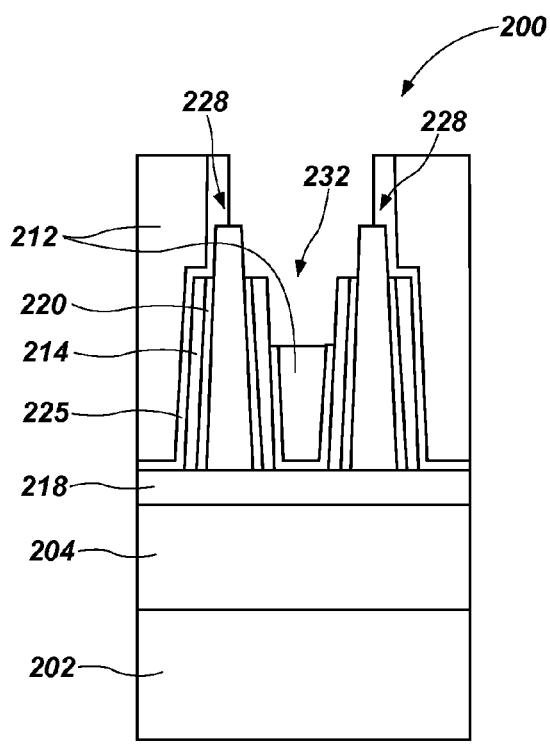

Referring to FIG. 2C, at least a portion of the dielectric material 212 between adjacent pillars 228 may be removed to expose at least a portion of one or more pillars 228 and at least a portion of the associated word lines 214. For example, recessed portion or recess 232 may be formed by a wet etch or a dry etch process that removes a portion of the dielectric material 212 and any liner material 225 from the pillar 228. In some embodiments (not shown), removal of the dielectric material 212 and the liner material 225 may expose only a top surface of the word lines 214, such that a top surface of the word line 214 is coplanar with a top surface of the dielectric material 212. In other embodiments (shown), a portion of sidewalls of the word line 214 may be exposed following removal of the dielectric material 212 and the liner material 225. For example, approximately one-quarter of the word line 214 is exposed by removing the dielectric material 212 and the liner material 225, as shown in FIG. 2C. In other embodiments (not shown), between approximately one-quarter and approximately three-quarters of the word line 214 may be exposed following removal of the dielectric material 212 and the liner material 225. By way of non-limiting example, the dielectric material 212 may be recessed between about 0 angstroms and about 850 angstroms relative to a top surface of the word lines 214. In other embodiments (not shown), all of the dielectric material 212 and liner material 225 between the adjacent pillars 228 is removed to expose at least a portion of the body connection line 218.

Figure 2D:
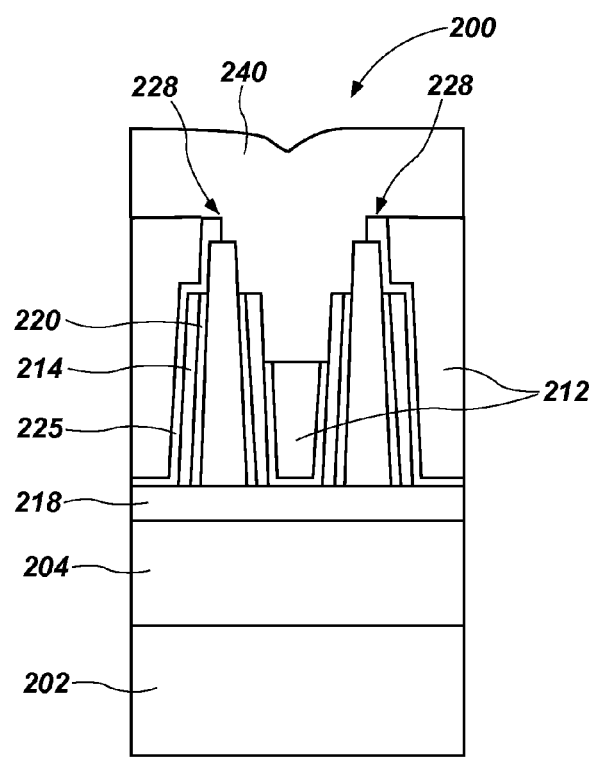

Referring to FIG. 2D, a conductive material 240 may be formed in the recessed portion 232. The conductive material 240 may form a contact between the exposed portions of the pillar 228 and one or more word lines 214. As shown, adjacent pillars 228 and at least one word line 214 from adjacent pillars 228 may be interconnected by the conductive material 240. The conductive material 240 may be in electrical communication with the body connection line 218 via one or more word lines 214 or via one or more pillars 228.

The conductive material 240 may be formed of any material suitable to create an electrical connection between the conductive material 240, the word lines 214, and the pillars 228. For example, in some embodiments, the conductive material 240 may include a polysilicon material including the same type of impurities as the pillars 228 and the body connection line 218. For example, if the body connection line 218 and the pillars 228 are formed of p-type semiconductor material, the conductive material 240 may be formed of p-type polysilicon. Similarly, if the body connection line 218 and the pillars 228 are formed of n-type semiconductor material, the conductive material 240 may be formed of n-type polysilicon.

In some embodiments, the conductive material 240 may include a metal material such as copper, tungsten, tungsten nitride, titanium nitride, titanium silicide, or combinations thereof. In yet other embodiments, the conductive material 240 may include a liner of doped polysilicon material formed in recess 232 with another conductive material formed thereon. For example, the conductive material 240 may include a doped polysilicon liner formed in recess 232 with a metal material such as tungsten, tungsten nitride, titanium nitride, titanium silicide, or combinations thereof filling the remainder of recess 232.

The conductive material 240 may be formed within the recess 232 and then doped with a suitable impurity or dopant. For example, where the conductive material 240 includes a doped p-type polysilicon material, the polysilicon may be formed within the recess 232 and then implanted with boron atoms, aluminum atoms, gallium atoms, or other p-type dopants. The polysilicon may be formed by conventional techniques, such as by, for example, CVD, ALD, LPCVD, PECVD, or any other suitable method. In other embodiments, doped polysilicon may be formed in situ. The dopant concentration within the polysilicon material may be substantially uniform throughout the conductive material 240. Where the conductive material 240 is formed from a metal material, the conductive material 340 may be formed by conventional techniques, such as by CVD, ALD, LPCVD, PECVD, or other suitable methods, such as evaporation or sputtering.

Figure 2E:
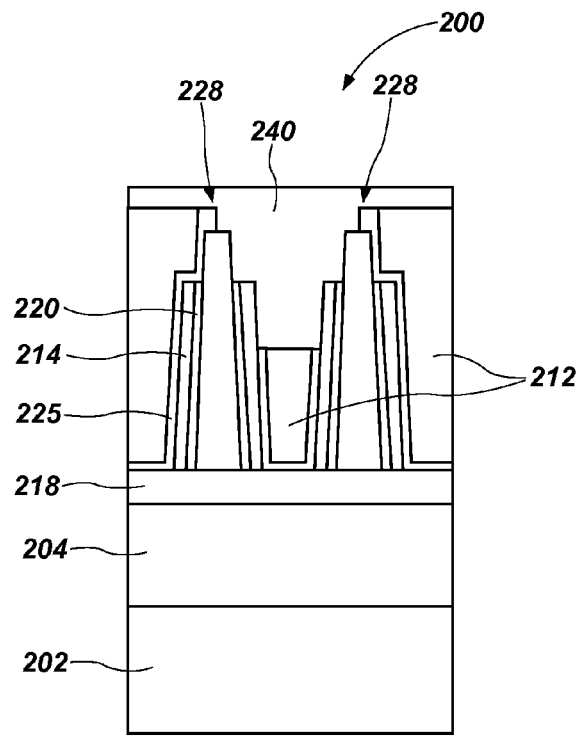

Referring to FIG. 2E, excess conductive material 240 may be removed from surfaces of the memory array 200. For example, the conductive material 240 may be removed by planarization techniques, such as chemical-mechanical planarization, or by chemical etching. After removing the excess conductive material 240, a top surface of the dielectric material 212 may be coplanar with a top surface of the conductive material 240. The word lines 214 may remain connected to the pillars 228 through conductive material 240. As shown in FIG. 2E, the conductive material 240 may create a continuous electrical connection between one or more word lines 214, one or more pillars 228, and the body connection line 218.

Referring back to FIG. 2A, an insulative material 250 may be formed over the vertical memory cells 201 and the pillars 228. The insulative material 250 may include, but is not limited to, a silicon oxide, BPSG, a nitride, or any dielectric material suitable for isolating structures. The conductive material 240 may create an electrical connection to the body connection line 218 through one or more word lines 214. The word lines 214 may be associated with a pillar 228, such as, for example, would be located in a transition region between a multiplexer and a memory circuit. In use and operation, such word lines 214 may have a ground voltage applied thereto. A voltage may be applied to the body region 206 of each of the vertical memory cells 201 through the body connection line 218. The voltage may be applied to the body connection line 218 through the pillar 228. The voltage may be applied to the pillar 228 through conductive material 240 and word line 214. By way of non-limiting example, a negative voltage may be applied through the word lines 214 of the pillars 228 to create a forward bias in the body region 206 of each of the vertical memory cells 201. The voltage applied to the body connection line 218 may aid in reducing undesired floating body effects.

Accordingly, a method of forming a semiconductor device is disclosed. The method comprises forming a body connection line over a substrate. At least one pillar is formed in contact with the body connection line. A mask comprising at least one opening is formed over the at least one pillar. A portion of a dielectric material adjacent to the at least one pillar is removed to expose at least one word line adjacent to the at least one pillar. A conductive material is formed in contact with the at least one word line and the at least one pillar.

Figure 2F:
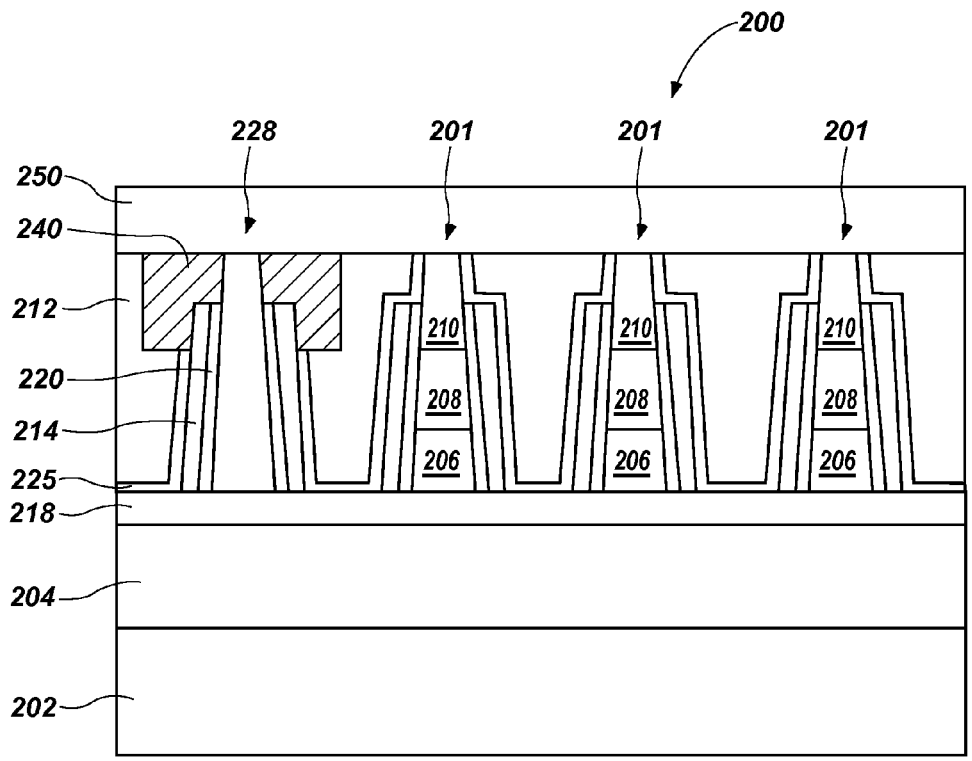
FIG. 2F is a simplified cross-sectional view of a portion of a memory array including vertical memory cells and pillars according to other embodiments of the present disclosure.

Referring to FIG. 2F, in other embodiments, conductive material 240 may receive a voltage from word lines 214 from a single pillar 228. The processing acts for forming the structure of FIG. 2F may be similar to those described above with relation to FIG. 2B through FIG. 2E, except that the opening 232 within the mask material 235 (FIG. 2B) may be shifted approximately one-half pitch such that the conductive material 240 is formed over a single pillar 228. Subsequent etching acts and formation of the conductive material 240 result in the structure shown in FIG. 2F. The resulting conductive material 240 connects a bias voltage applied to at least one word line 214 of a pillar 228 to the body connection line 218 of an entire row or column in the memory array 200. The connection is made without the need of additional processing acts to create the interconnection to the body connection line 218.

The devices shown in FIG. 2A and FIG. 2F may reduce or eliminate floating body effects. In operation, a bias voltage may be applied to the vertical memory cells 201 through the body connection line 218. The body connection line 218 may receive an appropriate first voltage through the pillar 228 to provide a path for charges to travel into and out of the body regions 206 of the vertical memory cells 201, which may reduce at least some of the adverse effects of a floating body that exist in the vertical memory cell 201. For example, if sufficient conductivity is established between the pillars 228 and the body regions 206, and an appropriate first voltage is applied to the pillars 228, the floating body effects may be reduced or eliminated. For example, leakage current from the body regions 206 may be reduced, and power dissipation in the memory array 200 may be more consistent and controlled.

Figure 2G:
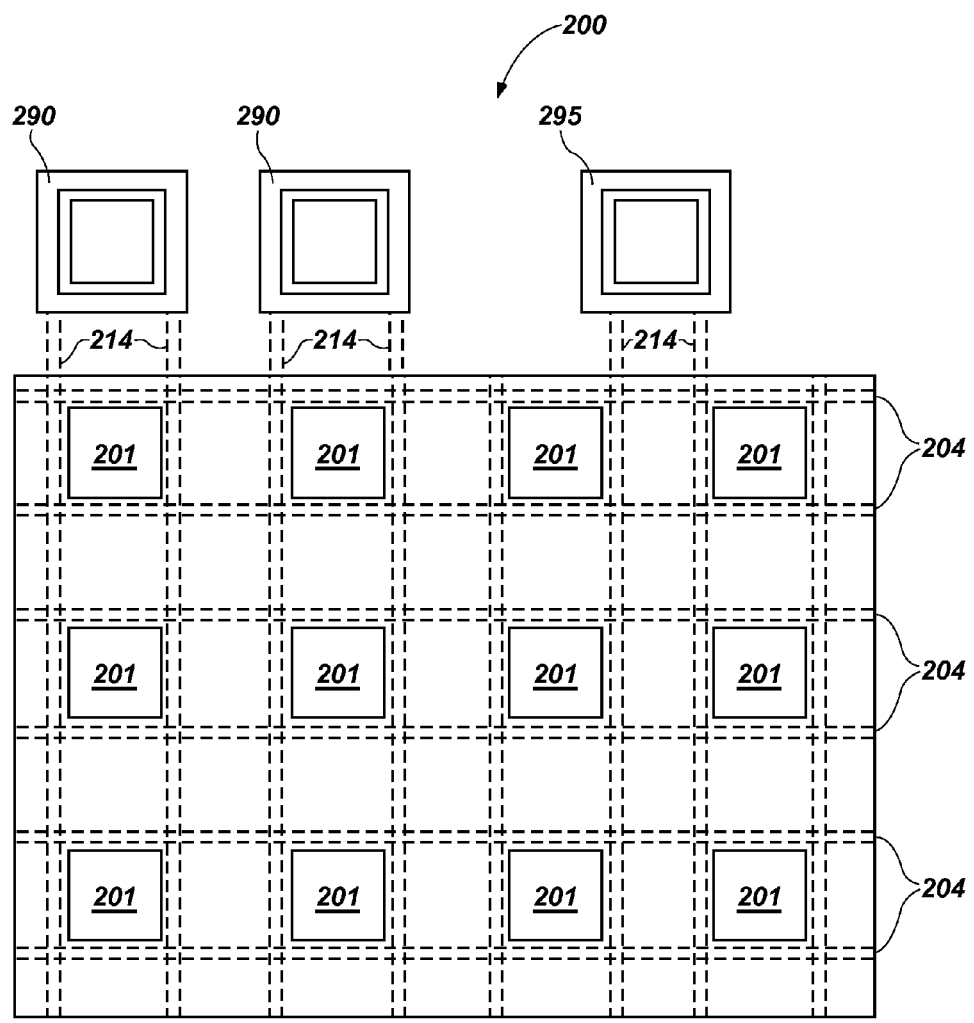
FIG. 2G and FIG. 2H are simplified plan views of a portion of memory arrays according to other embodiments of the present disclosure.

Referring to FIG. 2G, a plan view of the memory array 200 according to the embodiment described in relation to FIG. 2A is shown. The digit lines 204 may extend to a digit line contact (not shown) through which a voltage may be applied to the digit lines 204. Word lines 214 associated with vertical memory cells 201 may be connected to interconnect 290. Word lines 214 associated with the pillars 228 may be to interconnect 295. The interconnects 290, 295 may be located at a region peripheral to the memory array 200. The interconnects 295 may be formed in the same processing acts as formation of the interconnects 290, which processing acts are not described in detail herein.

Figure 2H:
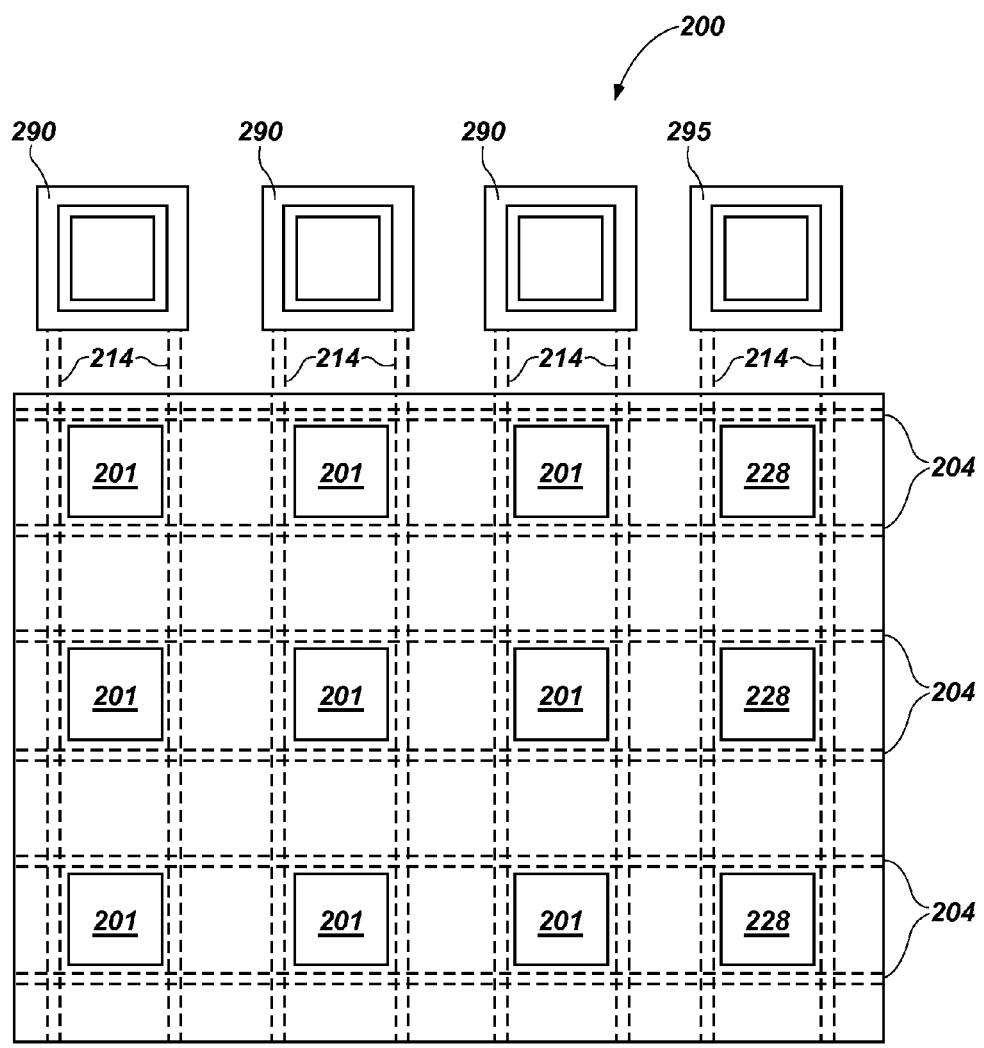

As shown in FIG. 2G, a word line 214 from one pillar 228 and a word line 214 from another pillar 228 may be connected to the same interconnect 295, such as may result from the device of FIG. 2A. Referring to FIG. 2H, the word lines 214 from a single pillar 228 may be connected to an interconnect structure 295. Although not shown, interconnects 295 may be located anywhere within the memory array 200 and are not limited to the end of a column or row and may be formed at intermittent locations within the memory array 200.

In some embodiments, interconnects 290, 295 may apply the same voltage to their associated word lines 214. In other embodiments, word lines 214 connected to interconnects 290 may receive a different voltage than word lines 214 connected to interconnects 295. In some embodiments, each of the body connection lines 218 in the memory array 200 may have the same first voltage applied thereto. For example, each of the body connection lines 218 may be connected to a common interconnect 295, as shown in FIG. 2G. In some embodiments, a first group of body connection lines 218 may be grouped into a subgroup, and at least a second group of body connection lines 218 may be grouped into at least another subgroup. Each subgroup of body connection lines 218 may be configured to receive a different voltage than the other subgroups. For example, a pillar 228 from one row may be connected to a different interconnect 295 than a pillar 228 from another row. The different interconnects 295 may apply the same or a different voltage to each of the pillars 228.

Figure 3A:
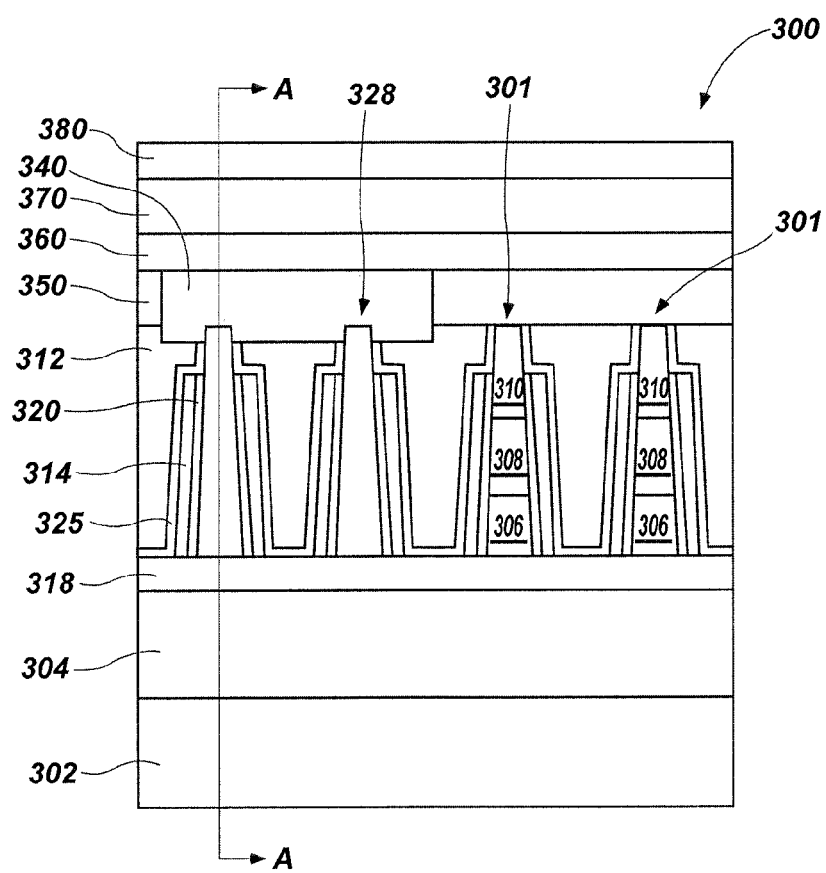
FIG. 3A is a simplified cross-sectional view of a portion of a memory array including vertical memory cells and pillars according to other embodiments of the present disclosure.

Referring to FIG. 3A, an electrical connection between a body connection line 318 and a conductive material 340 formed over a substrate 302 according to other embodiments is shown. The conductive material 340 may be formed under a top digit line 370. The body connection line 318 may be electrically connected to the conductive material 340 through at least one pillar 328. The conductive material 340 may be connected to an external voltage via an interconnect (not shown) that may be formed at an end of a row or column of a memory array 300. The interconnect may be formed through one or more materials such as an oxide material 350 and an insulative material 360 over dielectric 312. The top digit line 370 may overlie insulative material 360. A nitride material 380, such as a silicon nitride or an oxynitride material may overlie the top digit line 370. A voltage applied to the conductive material 340 may be applied to the pillar 328 and from the pillar 328 to the body connection line 318. Therefore, when a voltage is applied to the conductive material 340, a voltage may be applied to pillars 328, the body connection line 318, and the body regions 306 of the vertical memory cells 301.

The pillars 328 may be formed of the same materials as described above in relation to pillars 228 (FIG. 2A) and may be lined with a gate dielectric 320. For example, the pillars 328 may be formed of a doped silicon material such as a silicon material doped with n-type or p-type impurities. In some embodiments, the pillars 328 are formed from the same material as the body connection line 318.

Figure 3B:
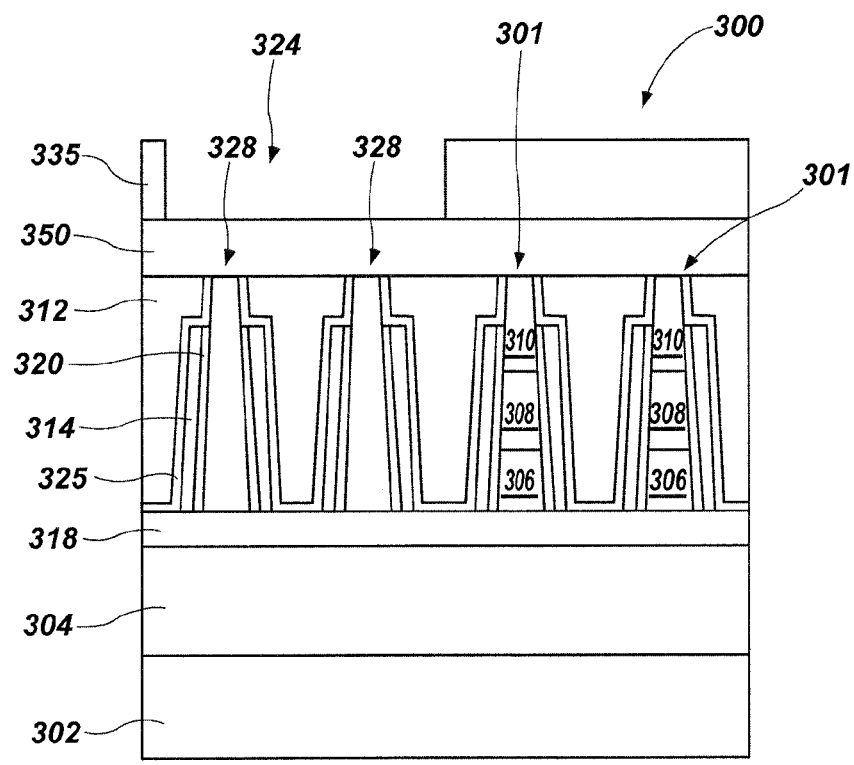
FIG. 3B through FIG. 3D are simplified cross-sectional views showing processing acts for forming the structure of FIG. 3A according to other embodiments of the present disclosure.

Referring to FIG. 3B, a mask material 335 similar to mask material 235 (FIG. 2B) may be formed over the oxide material 350 in the memory array 300. For example, the mask material 335 may be a photomask, a hard mask, an amorphous carbon mask, a transparent carbon mask, a negative mask, or combinations thereof. An opening 324 may be formed within the mask material 335 overlying one or more adjacent pillars 328. Although the opening 324 in the mask material 335 is shown as extending over two pillars 328 of a row, the opening 324 may extend over only one pillar 328 or more than two pillars 328 within the row. The opening 324 in the mask material 335 may be a continuous slot opening extending over pillars 328 in separate rows. In some embodiments, openings 324 in the mask material 335 may be spaced apart and may have a pitch equal to a pitch of digit lines 304 (i.e., a pitch of the rows of the memory array 300). A portion of the oxide material 350 overlying the one or more pillars 328 may be exposed through the mask material 335.

Figure 3C:
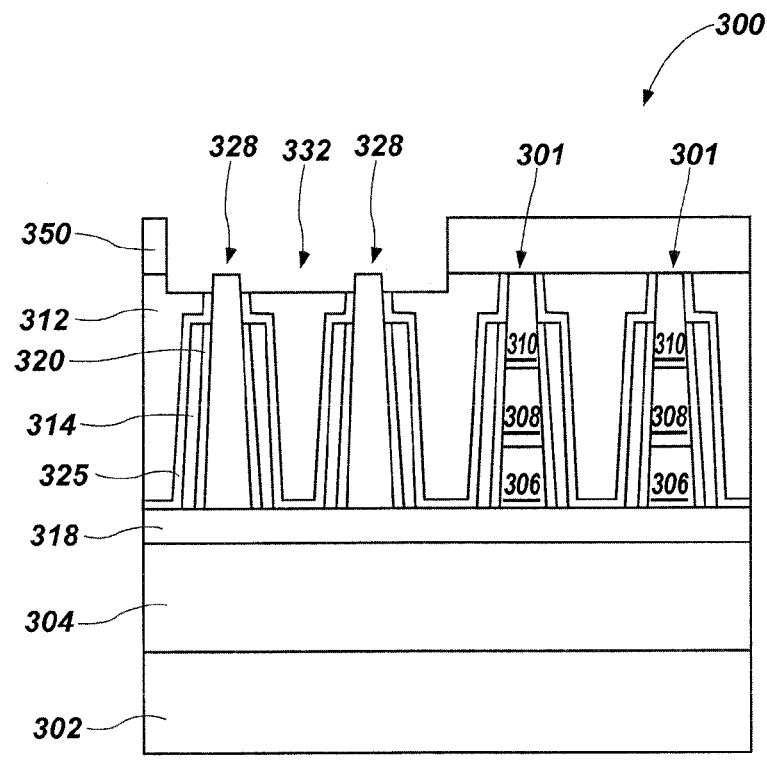

Referring to FIG. 3C, the oxide material 350 may be removed by a dry or wet etch process. Removing the oxide material 350 through the opening 324 in the mask material 335 may create recess 332 and expose at least a top portion of one or more pillars 328. A portion of the dielectric material 312 and liner material 325 may also be removed to expose a greater surface area of the pillars 328. For instance and as shown in FIG. 3C, a portion of the dielectric material 312 may be removed relative to the pillars 328 such that sidewalls of the pillars 328 are exposed and a top surface of the pillars 328 extends beyond a top surface of the dielectric 312.

Figure 3D:
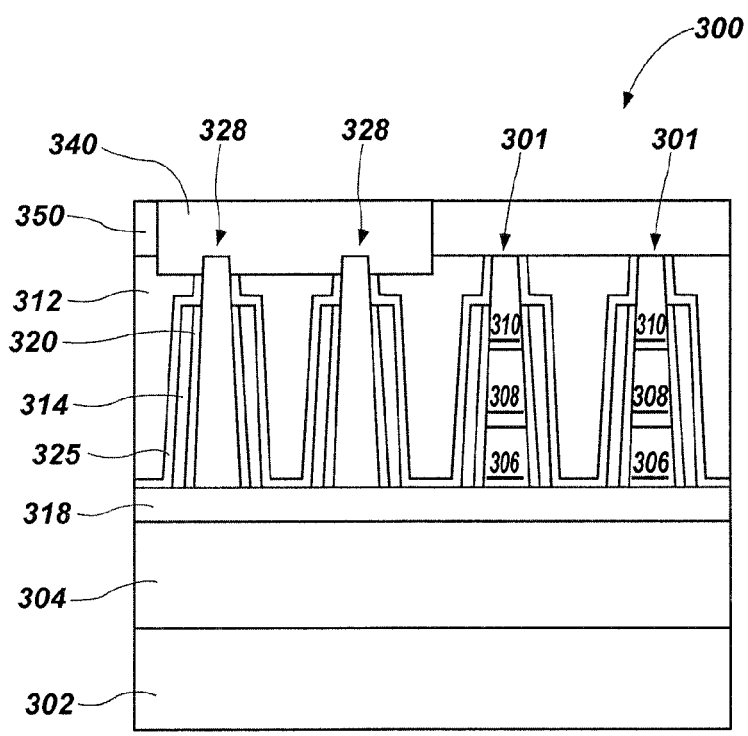

As shown in FIG. 3D, recess 332 may be filled with conductive material 340. Conductive material 340 may be formed as a plug contact over each pillar 328 or may be formed as a continuous material extending across several rows in a direction that is substantially orthogonal to body connection lines 318. The conductive material 340 may form a contact between exposed portions of the pillars 328 and may bridge adjacent pillars 328. The conductive material 340 may be in electrical communication with the body connection line 318 through one or more pillars 328.

The conductive material 340 may be formed of any material sufficient to create an electrical connection between the conductive material 340 and the pillars 328, such as a material as described above with reference to conductive material 240. For example, the conductive material 340 may include a polysilicon material such as doped polysilicon comprising the same impurities as pillars 328 and the body connection line 318. Conductive material 340 may include a polysilicon material such as doped p-type or n-type polysilicon. Conductive material 340 may include a metal material such as copper, tungsten, tungsten nitride, titanium nitride, titanium silicide, or combinations thereof. In other embodiments, conductive material 340 may include a polysilicon material lining recess 332 and a metal material, such as copper, tungsten, tungsten nitride, titanium nitride, titanium silicide, or combinations thereof, filling in the remainder of recess 332.

Where the conductive material 340 includes a doped polysilicon material, the conductive material 340 may be formed as an undoped polysilicon material and then doped with a suitable impurity or dopant. For example, where the conductive material 340 comprises a p-type polysilicon material, the polysilicon may be implanted with boron atoms, aluminum atoms, gallium atoms, or other p-type dopants. The polysilicon may be formed by conventional techniques, such as by, for example, CVD, ALD, LPCVD, PECVD, or any other suitable method. In some embodiments, the doped polysilicon may be formed in situ. The dopant concentration within the polysilicon material may be substantially uniform throughout the conductive material 340. Where the conductive material 340 comprises a metal material, the conductive material 340 may be formed by evaporation, sputtering, or deposition, such as by CVD, ALD, LPCVD, or PECVD.

Any conductive material 340 formed outside recess 332 may be removed from surfaces of the oxide material 350 overlying vertical memory cells 301. The conductive material 340 may be removed by planarization techniques, such as chemical-mechanical planarization, or chemical etching.

Figure 3E:
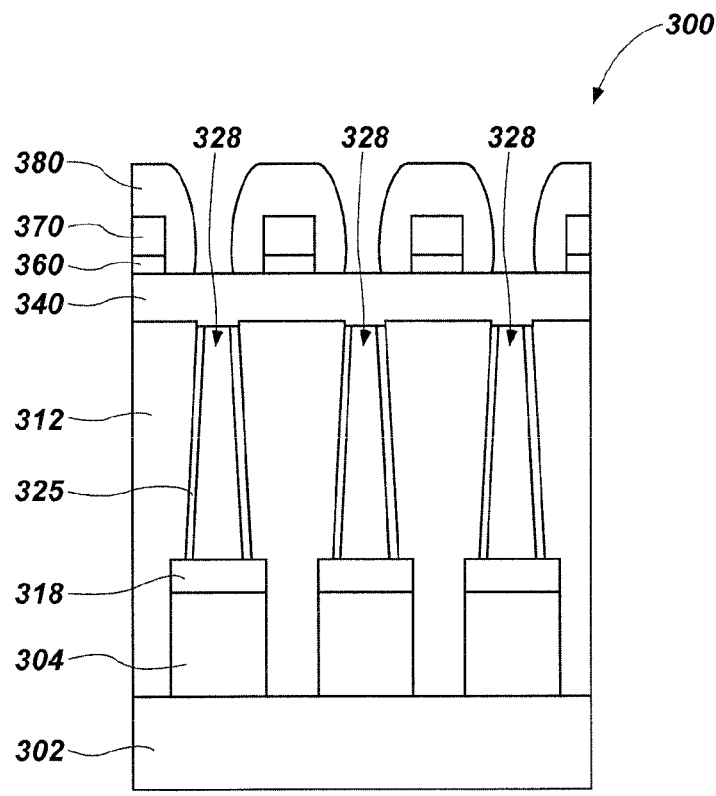
FIG. 3E is a simplified cross-sectional view of a portion of a memory array showing pillars in adjacent rows of the memory array according to other embodiments of the present disclosure.

Referring to FIG. 3E, a cross-section of the structure in FIG. 3A is shown. The cross-section shown in FIG. 3E is taken along section line A-A in FIG. 3A. As shown in FIG. 3E, an insulative material 360 may be formed over the conductive material 340. In other words, the insulative material 360 may be formed in the regions between adjacent rows within the memory array 300. Insulative material 360 may be formed of a silicon oxide, BPSG, a nitride, or any dielectric material for insulating the conductive material 340 from a top digit line 370. The top digit line 370 may be formed over the insulative material 360. The top digit line 370 may form a contact with any part of the semiconductor device, such as, for example, storage elements 310 of the vertical memory cells 301. A nitride material 380 may be conformally formed over the top digit line 370. An interconnect (not shown) may be formed to connect the conductive material 340 to a voltage source. For example, at the end of the array, such as at the end of a row of the memory array 300, an interconnect may be formed to connect the conductive material 340 to a metal interconnect structure.

The structure of FIG. 3A may reduce or eliminate floating body effects. In use and operation, the body connection line 318 may receive an appropriate first voltage through the pillar 328 to provide a path for charges to travel into and out of the body regions 306 of the vertical memory cells 301, which may reduce at least some of the adverse effects of a floating body that exists in a vertical memory cell. For example, if sufficient conductivity is established between the pillars 328 and the body regions 306, and an appropriate first voltage is applied to the pillars 328, the floating body effects may be reduced or eliminated. For example, leakage current from the body regions 306 may be reduced, and power dissipation in the memory array 300 may be more consistent and controlled. As a result, charge build-up within the body regions 306 may be encouraged or discouraged, according to the desired operation, providing control over leakage currents and threshold voltages without significantly increasing processing acts or surface area of the memory array 300.

Figure 4A:
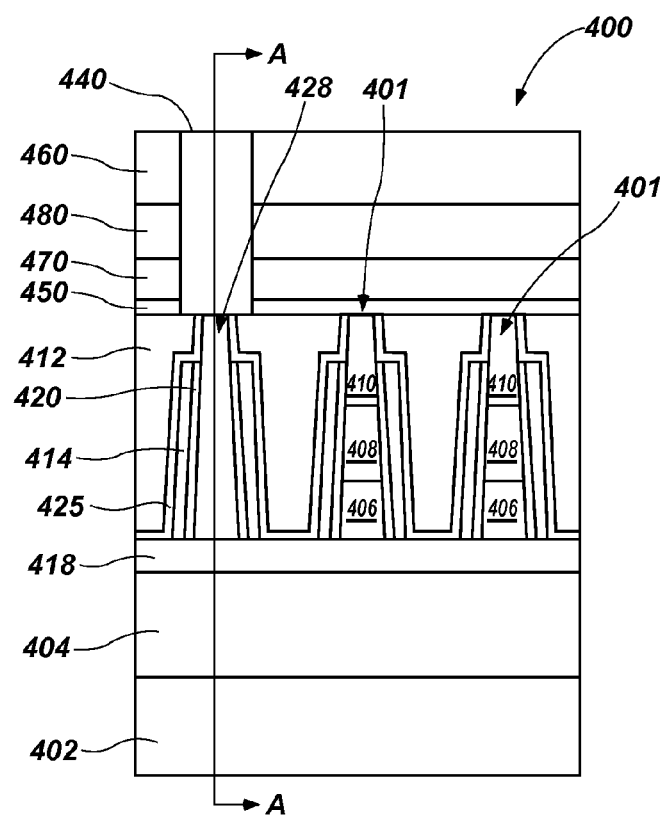
FIG. 4A is a simplified cross-sectional view of a portion of a memory array including vertical memory cells and pillars according to other embodiments of the present disclosure.

Referring to FIG. 4A, a device with an electrical connection to a body connection line 418 according to other embodiments is shown. A conductive material 440 may be formed over a top digit line 470. The body connection line 418 may be connected to the conductive material 440 through at least one pillar 428 that may be lined with a gate dielectric 420. The conductive material 440 may be connected to an external voltage through an interconnect (not shown) that may be formed at an end of a row or column of a memory array 400. A voltage may be applied to the conductive material 440 through the interconnect. Application of a voltage to the conductive material 440 may apply a voltage to the pillar 428 and to the body connection line 418. An oxide material 450, such as a silicon oxide, may overlie the vertical memory cells 401 and the one or more pillars 428. The top digit line 470 may overlie the oxide material 450. A nitride material 480 may overlie the top digit line 470 and may comprise a nitride such as silicon nitride, silicon oxynitride, or other nitride material. An insulative material 460 may overlie the nitride material 470 and may comprise a silicon oxide, BPSG, a nitride, or any dielectric for isolating structures. The top digit line 470 may form a contact with any part of the semiconductor device, such as, for example, storage elements 410 of the vertical memory cells 401. A voltage applied to the conductive material 440 through the interconnect may also be applied to the pillar 428, the body connection line 418, and body regions 406 of the vertical memory cells 401.

The pillars 428 may be formed of the same materials as described above in relation to pillars 228 (FIG. 2A). For example, the pillars 428 may be formed of a doped silicon material such as a silicon material doped with n-type or p-type impurities. In some embodiments, the pillars 428 are formed from the same material as the body connection line 418.

Accordingly, a semiconductor device is disclosed. The semiconductor device includes access devices over a digit line in a row of a memory array. A body connection line is over the digit line and contacts a body portion of the access devices. At least one pillar is adjacent to an access device of the access devices and is in contact with the body connection line. A conductive material is overlying and contacting the at least one pillar.

Figure 4B:
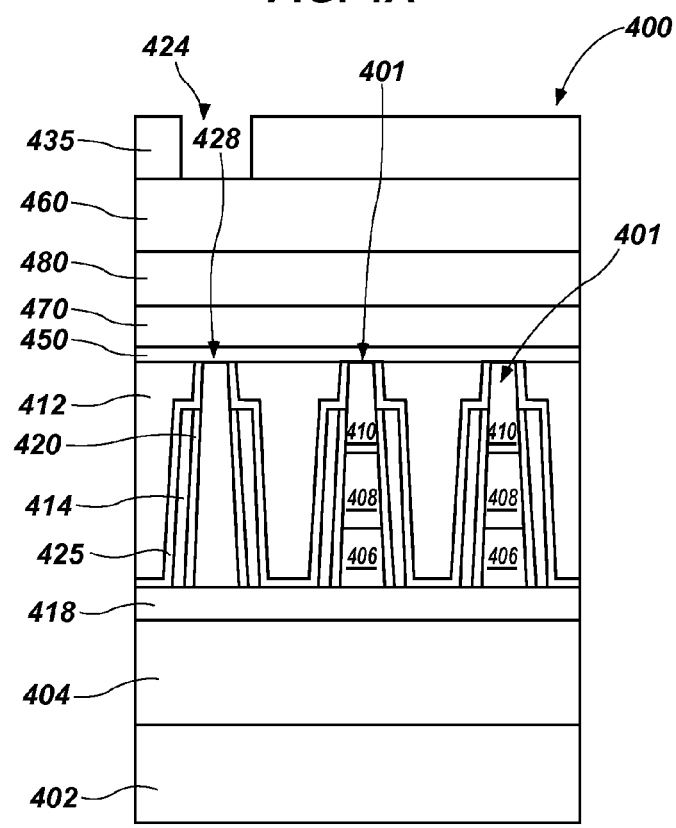
FIG. 4B and FIG. 4C are simplified cross-sectional views showing processing acts for forming the structure of FIG. 4A according to other embodiments of the present disclosure.

Referring to FIG. 4B, a mask material 435 may be formed over the memory array 400, such as over the insulative material 460. The mask material 435 may be similar to mask material 235 (FIG. 2B). For example, the mask material 435 may be a photomask, a hard mask, an amorphous carbon mask, a transparent carbon mask, a negative mask, or combinations thereof. An opening 424 may be formed through the mask material 435 and overlying one or more pillars 428. The opening 424 in the mask material 435 may have a pitch equal to a pitch of digit lines 404 (i.e., a pitch of the rows of the memory array 400). A portion of the insulative material 460 overlying the one or more pillars 428 may be exposed through the opening 424 in the mask material 435.

Figure 4C:
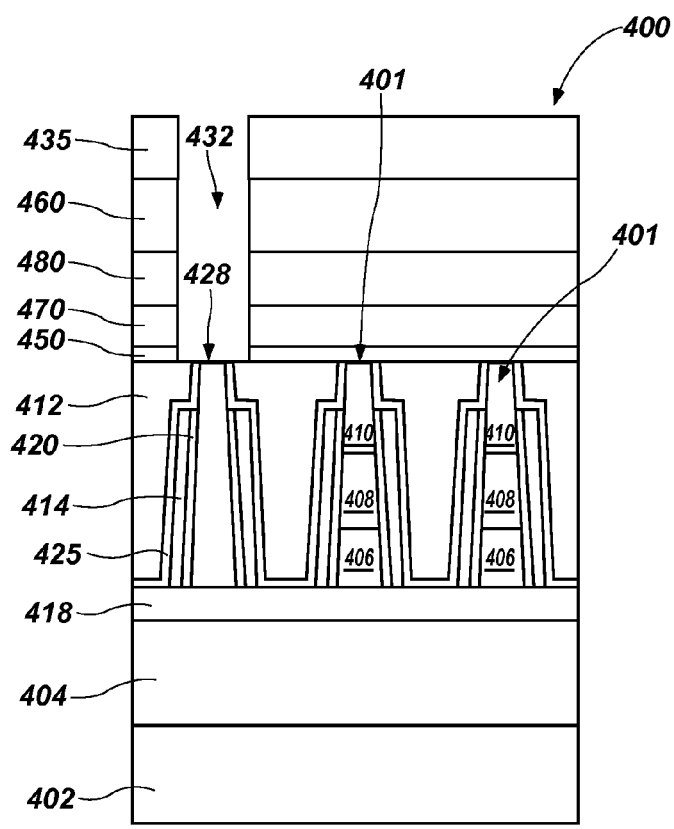

Referring to FIG. 4C, portions of the insulative material 460, the nitride material 480, the top digit line 470, and oxide material 450 may be removed through the opening 424 in the mask material 435. A dry or wet etch process may be used to remove the material underlying the opening 424 in the mask material 435 to form recess 432 and expose at least a top surface of one or more pillars 428. Although not shown, a portion of a dielectric material 412 and liner material 425 may also be removed to expose a greater surface area of the pillars 428. Thus, a portion of the dielectric material 412 may be recessed relative to the one or more pillars 428 such that a portion of the pillars 428 extends above the dielectric material 412.

Referring back to FIG. 4A, the recess 432 may be filled with conductive material 440. Conductive material 440 may be formed as a plug contact over the pillars 428. The conductive material 440 may be in contact with the exposed portion of the one or more pillars 428. In some embodiments, contact between the conductive material 440 and the pillar 428 may be only at a top, protruding surface of the pillar 428. In other embodiments, the conductive material 440 may be in contact with at least a portion of the pillar 428 below a top surface of the pillar 428.

Conductive material 440 may include any material as described above with reference to conductive material 240. For example, the conductive material 440 may include a polysilicon material such as doped polysilicon comprising the same impurities as pillars 428 and the body connection line 418. Conductive material 440 may include a polysilicon material such as doped p-type or n-type polysilicon. Conductive material 440 may include a metal material such as copper, tungsten, tungsten nitride, titanium nitride, titanium silicide, or combinations thereof. In other embodiments, conductive material 440 may include a polysilicon material lining recess 432 and a metal material such as copper, tungsten, tungsten nitride, titanium nitride, titanium silicide, or combinations thereof filling in the remainder of recess 432.

Where the conductive material 440 comprises a polysilicon material, the conductive material 440 may be formed as an undoped polysilicon material and then doped with a suitable impurity or dopant. For example, where the conductive material 440 comprises a p-type polysilicon material, the polysilicon may be implanted with boron atoms, aluminum atoms, gallium atoms, or other p-type dopants. The polysilicon may be formed by conventional techniques, such as by, for example, CVD, ALD, LPCVD, PECVD, or any other suitable method. In other embodiments, doped polysilicon may be formed in situ. The dopant concentration within the polysilicon material may be substantially uniform throughout the conductive material 440. Where the conductive material 440 comprises a metal material, the conductive material 440 may be formed by evaporation, sputtering, or deposition, such as by CVD, ALD, LPCVD, or PECVD.

Any conductive material 440 formed outside recess 432 may be removed from surfaces of the insulative material 460 overlying vertical memory cells 401. The conductive material 440 may be removed by planarization techniques, such as chemical-mechanical planarization, or chemical etching. An interconnect may be formed at the end of a row or column to connect the conductive material 440 to a voltage source (not shown). The conductive material 440 may thereby receive a voltage to be applied to the pillar 428, the body connection line 418, and body regions 406 of the vertical memory cells 401.

Accordingly, a method of forming a semiconductor device is disclosed. The method comprises forming a body connection line over a digit line. At least one pillar is formed over the body connection line and adjacent to at least one vertical memory cell of a row of vertical memory cells. A mask is formed over the row of vertical memory cells. An opening is formed in the mask over the at least one pillar. A dielectric material is removed through the opening in the mask to expose a portion of the at least one pillar. A conductive material is formed in contact with the portion of the at least one pillar.

Figure 4D:
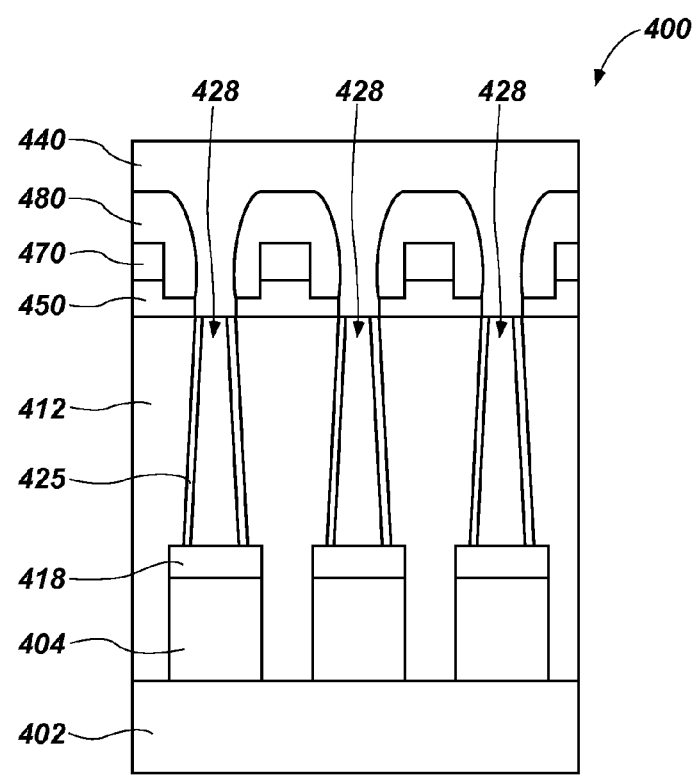
FIG. 4D is a simplified cross-sectional view of a portion of a memory array showing pillars in adjacent rows of the memory array according to other embodiments of the present disclosure.

Referring to FIG. 4D, a cross-section of the structure of FIG. 4A is shown. The cross-section shown in FIG. 4D is taken along section line A-A in FIG. 4A. As shown in FIG. 4D, the conductive material 440 may not contact top digit line 470. For example, conductive material 440 may be located over pillars 428 in each row of a memory array 400 and the top digit lines 470 may be located in regions between adjacent rows of the memory array 400. The conductive material 440 may, thus, be separated from the top digit lines 470 at least by oxide material 450 and nitride material 480. The top digit lines 470 may be disposed in the regions between adjacent rows within the memory array 400.

The structure of FIG. 4A may reduce or eliminate floating body effects. In use and operation, the body connection line 418 may receive an appropriate first voltage through the pillar 428 to provide a path for charges to travel into and out of the body regions 406 of the vertical memory cells 401, which may reduce at least some of the adverse effects of a floating body that exists in a conventional vertical memory cell 401. For example, if sufficient conductivity is established between the pillars 428 and the body regions 406, and an appropriate first voltage is applied to the pillars 428, the floating body effects may be reduced or eliminated. For example, leakage current from the body regions 406 may be reduced, and power dissipation in the memory array 400 may be more consistent and controlled. As a result, charge build-up within the body regions 406 may be encouraged or discouraged, according to the desired operation, providing control over leakage currents and threshold voltages.

A memory array 300, 400 including the structures described with reference to FIG. 3A and FIG. 4A may be similar to that shown in FIG. 2H. For example, interconnect structures connecting word lines 314, 414 of vertical memory cells 301, 401 to a voltage source and interconnects connecting word lines 314, 414 of pillars 328, 428 to a voltage source may be similar to those described above with reference to FIG. 2H.

Figure 5:
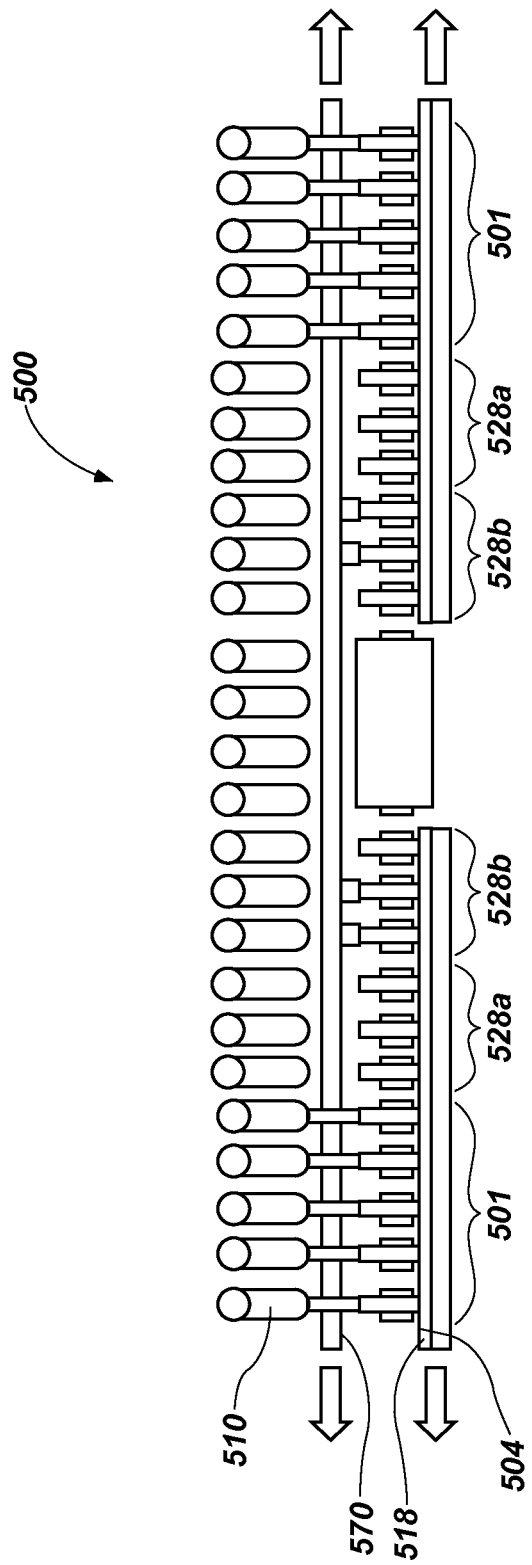
FIG. 5 is a simplified schematic of a portion of a memory array including vertical memory cells, dummy pillars, and transition pillars.

Referring to FIG. 5, a portion of a memory array 500 is shown. The memory array 500 may include a region of vertical memory cells 501, a region of dummy pillars 528a, and a region of transition pillars 528b. Vertical memory cells 501 may be connected to a bottom digit line 504, a top digit line 570, and to a storage element 510. The dummy pillars 528a may be connected to the bottom digit line 504 but may not be connected to the top digit line 570 or to a storage element 510. The transition pillars 528b may be connected to the bottom digit line 504 and to the top digit line 570 but may not be connected to a storage element 510. The transition pillars 528b may be in a transition region between an active cell region including vertical memory cells 501 and a region peripheral to the active cell region, such as a multiplexer or a demultiplexer region. The vertical memory cells 501, the dummy pillars 528a, and the transition pillars 528b may be connected to the bottom digit line 504. A body connection line 518 may overlie the bottom digit line 504 and may contact a body portion of each of the vertical memory cells 501, the dummy pillars 528a, and transition pillars 528b. A bias voltage may be applied to the body connection line 518 through the dummy pillars 528a and through transition pillars 528b, as described above with reference to pillars 228, 328, and 428. Thus, a bias voltage may be applied to the body connection line 518 to reduce floating body effects without requiring excess real estate of the memory array 500.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure as contemplated by the inventors.

What is claimed is:

1. A semiconductor device, comprising: a pillar adjacent to at least one vertical memory cell of a memory array; a body connection line extending continuously between the pillar and a body portion of the at least one vertical memory cell and electrically connected to the pillar and to the body portion of the at least one vertical memory cell; a first word line extending along a vertical length of the pillar; a second word line along the at least one vertical memory cell, wherein the first word line is configured to receive a different voltage than the second word line; and a conductive material directly contacting the pillar and the first word line.

2. The semiconductor device of claim 1, wherein the pillar comprises a doped silicon material.

3. The semiconductor device of claim 1, wherein the pillar and the body connection line comprise the same material.

4. The semiconductor device of claim 1, wherein the conductive material comprises a doped polysilicon material.

5. The semiconductor device of claim 1, wherein the second word line and the body portion of the at least one vertical memory cell form a gate.

6. The semiconductor device of claim 1, further comprising a dielectric material between the pillar and the at least one vertical memory cell.

7. The semiconductor device of claim 1, wherein the first word line is coupled to the body connection line.

8. The semiconductor device of claim 1, wherein the body connection line comprises only one of a p-type semiconductor material or an n-type semiconductor material.

9. A method of forming a semiconductor device, comprising: forming a body connection line comprising one of a p-type semiconductor material or an n-type semiconductor material and extending continuously between at least one pillar adjacent to at least one vertical memory cell of a memory array over a substrate, the body connection line electrically connected to the at least one pillar and a body portion of the at least one vertical memory cell of the memory array; forming a mask over the at least one pillar, the mask comprising at least one opening; removing at least a portion of a material adjacent to the at least one pillar to expose at least one word line along a vertical length of at least one pillar; forming another word line along the at least one vertical memory cell the at least one word line configured to receive a different voltage than the another word line; and forming a conductive material directly contacting the at least one word line and the at least one pillar.

10. The method of claim 9, wherein removing at least a portion of a material adjacent to the at least one pillar to expose at least one word line along a vertical length of the at least one pillar further comprises removing a liner material from sidewalls of the at least one pillar and the at least one word line.

11. The method of claim 9, wherein removing at least a portion of a material adjacent to the at least one pillar to expose at least one word line along a vertical length of the at least one pillar further comprises exposing he another word line.

12. The method of claim 9, wherein forming a conductive material directly contacting the at least one word line and the at least one pillar comprises forming a conductive material comprising polysilicon in contact with the at least one word line and the at least one pillar.

13. The method of claim 9, further comprising planarizing the conductive material.

14. The method of claim 13, further comprising forming an oxide material over the conductive material.

15. A semiconductor device, comprising: access devices over a digit line in a row of a memory array over a substrate; a body connection line over the digit line and contacting a body portion of the access devices; at least one pillar adjacent to an access device of the access devices and in contact with the body connection line; a conductive material overlying and in contact with the at least one pillar, the conductive material configured to receive a voltage from a conductive metal interconnect; and another digit line over the conductive material and in contact with a storage element of the access devices.

16. The semiconductor device of claim 15, wherein the body connection line comprises the same material as the at least one pillar.

17. The semiconductor device of claim 15, wherein the conductive material is in contact with at least two pillars.

18. The semiconductor device of claim 15, wherein the body connection line comprises semiconductor material doped with carriers opposite carriers of the digit line.

19. A method of forming a semiconductor device, comprising: forming access devices over a digit line in a row of a memory array over a substrate; forming a body connection line over the digit line and contacting a body portion of the access devices; forming at least one pillar over the body connection line and adjacent to at least one access device of the access devices and in contact with the body connection line; forming a mask over the memory array; forming an opening in the mask over the at least one pillar; removing a dielectric material through the opening in the mask to expose a portion of the at least one pillar; forming a conductive material overlying and in contact with the portion of the at least one pillar and in contact with at least one word line associated with the at least one pillar, the conductive material configured to receive a voltage from a conductive metal interconnect; and forming another digit line over the conductive material and in contact with a storage element of the access devices.

20. The method of claim 19, wherein removing a dielectric material through the opening in the mask to expose a portion of the at least one pillar comprises exposing a top surface and sidewalls of the at least one pillar.

21. The method of claim 19, wherein removing a dielectric material through the opening in the mask to expose a portion of the at least one pillar comprises etching an oxide material to expose a portion of the at least one pillar.

22. The method of claim 19, wherein forming a conductive material overlying and in contact with the portion of the at least one pillar comprises forming a p-type polysilicon material in contact with an exposed portion of the at least one pillar comprising a p-type silicon material.

23. A semiconductor device, comprising: a pillar adjacent to at least one vertical memory cell of a memory array; a body connection line electrically connected to the pillar and to a body portion of the at least one vertical memory cell; a first word line along the pillar; a second word line along the at least one vertical memory cell, the second word line and the body portion of the at least one vertical memory cell forming a gate, wherein the first word line is configured to receive a different voltage than the second word line; and a conductive material electrically connected to the pillar and to the first word line.

* * * * *